United States Patent [19]

Rosen et al.

[11] 3,728,645

[45] Apr. 17, 1973

[54] HIGH MODULATION INDEX OSCILLATOR-MODULATOR CIRCUIT

[75] Inventors: Charles Rosen, Philadelphia; Martin J. Arcaro, Penndel, both of Pa.

[73] Assignee: Microcom Corporation, Horsham, Pa.

[22] Filed: May 20, 1971

[21] Appl. No.: 145,185

[52] U.S. Cl. ....................332/26, 307/271, 331/36 C, 331/65, 332/30 V

[51] Int. Cl. ..............................................H03c 3/28

[58] Field of Search ........................332/16, 16 T, 30, 332/30 V, 26; 331/23, 36 C, 65, 158, 177 V; 307/295, 271, 262; 325/145, 148, 105

[56] References Cited

UNITED STATES PATENTS

| | | | |
|---|---|---|---|
| 2,515,030 | 7/1950 | Beleskas | 332/26 |
| 3,260,960 | 7/1966 | Bangert | 332/26 X |
| 3,464,031 | 8/1969 | Rosen | 332/26 |
| 2,510,868 | 6/1950 | Day | 331/158 X |
| 2,561,989 | 7/1951 | Madsen | 332/26 |
| 3,252,154 | 5/1966 | McKee et al | 325/105 UX |

*Primary Examiner*—Alfred L. Brody
*Attorney*—Paul & Paul

[57] ABSTRACT

An oscillator-modulator circuit is disclosed wherein a high modulation index is obtained by shunting across the crystal of an oscillator a first capacitance derived across the output terminals of a modulation amplifier transistor and a second capacitance derived across the input terminals of the oscillator transistor, such first and second capacitances being time varied by the modulation signal. Oscillator startup under low temperature conditions is aided by circuit delay in coupling the effective capacitance of the modulator amplifier transistor in shunt with the crystal, thereby providing higher closed loop gain of the oscillator during the initial start-up time period.

2 Claims, 1 Drawing Figure

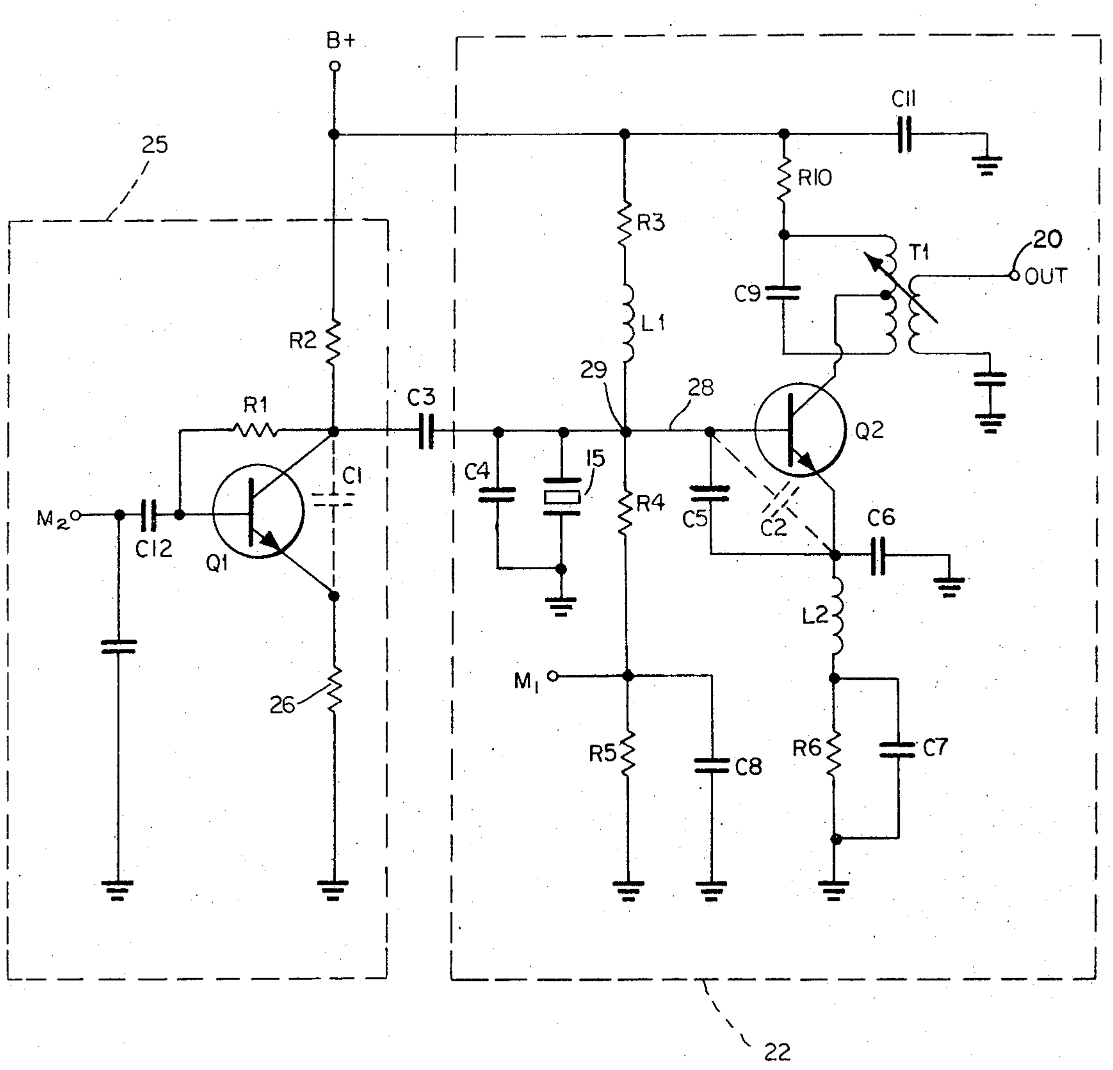
INVENTORS.
Charles Rosen
Martin J. Arcaro
BY
Paul + Paul
ATTORNEYS.

HIGH MODULATION INDEX OSCILLATOR-MODULATOR CIRCUIT

BACKGROUND OF THE INVENTION

1. Field of the Invention

This invention lies in the field of oscillator-modulator circuits and, more particularly, high modulation index oscillator-modulators.

2. Description of the Prior Art

The design of highly efficient and small sized transmitters is very important for the operation of modern telemetry systems. An example of a prior art device utilized in this field is the single transistor oscillator-modulator-multiplier circuit disclosed in U. S. Pat. No. 3,464,031, assigned to the assignee of this application. It was disclosed in that patent that efficient modulation may be obtained by placing a capacitance of fixed value in shunt with the crystal of a crystal-controlled oscillator, and time varying the effective base to emitter capacitance of the oscillator transistor with the modulation input signal, which time varying capacitance also shunts the crystal and results in amplitude and phase modulation.

Subsequent investigations have determined a need for an increased modulation index, as well as for an improved circuit allowing for more reliable oscillator start-up under cold temperature conditions. It has been found that the higher the fixed capacitance in shunt with the crystal, the more limited is the obtainable modulation index, and the lower is the closed loop gain of the oscillator at start-up, resulting in start-up failure under low temperature conditions. There thus exists a need for a simple and inexpensive improvement of the prior art whereby a higher modulation index and a more reliable start-up is attained.

SUMMARY OF THE INVENTION

The primary purpose of this invention is to provide an improved modulator-oscillator circuit characterized by an increased modulation index and reliable oscillator starting under low temperature conditions.

Another purpose of this invention is to provide a circuit combining a modulation amplifier with a modulator-oscillator wherein the characteristics of the modulation amplifier enhance the modulation capability of the modulation-oscillator.

In accordance with the above, a circuit is provided comprising a one-transistor modulation amplifier which amplifies the modulation signal and has an output impedance characterized by an effective output capacitance which is time varied by the modulation signal, the output of the modulation amplifier being capacitively coupled to a crystal controlled oscillator having a single transistor, said crystal being shunted by the output capacitance of the modulator amplifier and the input capacitance of the oscillator transistor, as well as by a fixed value capacitance. The variation of the two transistor shunt capacitances caused by the modulation signal causes amplitude and phase modulation of the oscillator RF signal, with a high modulation index attainable due to the relatively low fixed capacitance and the combined variable capacitance. The time delay in reaching quiescent operating conditions in the modulation amplifier permits high gain starting of the oscillator before the full effective output capacitance of the modulation amplifier transistor is placed in shunt across the crystal.

BRIEF DESCRIPTION OF THE DRAWING

The drawing is a schematic diagram of the circuit of this invention, the portion designated 22 representing the prior art.

DESCRIPTION OF THE PREFERRED EMBODIMENT

Referring now to FIG. 1, portion 22 comprises a conventional Pierce type oscillator in the common emitter mode, with a tank circuit comprising C9 and T1 which detects a harmonic of the crystal and accordingly acts as a multiplier of the crystal frequency. When using only portion 22, the modulation signal is coupled to the circuit at node M1, between resistors R4 and R5. The active element in the oscillator circuit of FIG. 1 is transistor Q2. Capacitors C5 and C6 are selected to provide proper feedback voltage to sustain oscillation. Coil L2 is the RF load at the steady state oscillator frequency. The series path connected between the positive power supply and ground, comprising R3, L1, R4 and R5 in series, together with the connection 28 from node 29 to the base of transistor Q2, establishes the desired operating point of the circuit.

Crystal 15 is the prime determinate of the operating frequency of the oscillator, and is shunted by a fixed capacitor C4. The connection of capacitor C4 across crystal 15 causes only a very slight variation in the operating frequency of the oscillator. However, the size of this capacitance affects the amplitude of the signal produced by the oscillator, since it has a direct effect on the loop gain of the oscillator circuit. Also affecting the amplitude of the oscillator signal is effective capacitance C2 between base and emitter of transistor Q2, which capacitance is a function of the instantaneous base to emitter voltage, as is well known in the art. When an input signal is coupled to node M1, such base to emitter voltage varies with the relatively low frequency modulation signal, causing a corresponding variation of the base-emitter junction capacity, which in turn causes a time varying amplitude modulation of the oscillator signal. The larger the value of the total capacitance in shunt with the crystal, the smaller the amplitude of the oscillation signal, and the smaller the value of such total shunt capacitance, the larger the amplitude of the oscillation signal.

In practice, when the modulation signal is connected to node M1, the time variation of capacitance C2 produces a corresponding amplitude modulation of the oscillator signal. The amplitude modulated signal inherently carries a corresponding phase modulation. By coupling the output at the out node 20 to a subsequent class C operating amplifier, or equivalent limiting device, the amplitude modulation can be eliminated, resulting in a solely phase modulated signal.

Fixed capacitance C4 is selected to cooperate with crystal 15 so as to provide an unmodulated oscillator signal of just such amplitude so that when a modulation signal is connected to node M1, linear phase modulation results. It is noted that absent a modulation signal, the effective value of capacitance C2 corresponds to the steady state operation of the oscillator. When the relatively slow modulation signal is connected at node M1, a relatively slowly varying signal is superimposed across the base-emitter terminals, so as to provide a time variation of effective capacitance C2. It is the value of fixed capacitor C4 plus the steady state value of C2 which determines the amplitude of the oscillation signal under conditions of no modulation signal, and it is the time variation of the amplitude of the modulation signal which produces the resulting amplitude and phase modulation.

The prior art circuit is seen to be modified by the addition of a modulation amplifier 25 having its output capacity coupled to the base of Q2. Modulation amplifier 25 consists of a transistor Q1 in common emitter configuration, having a load resistor R2 connected between its collector and the power supply, a bias resistor R1 connected between the collector and the base, and an emitter resistor 26 (for varying gain of the amplifier) connected between the emitter and ground. The input node M2, where the modulation signal is applied, is capacitively coupled through capacitor C12 to the base of Q1.

Transistor Q1 has an effective output capacitance C1, shown connected between the collector and emitter of transistor Q1. This capacitance provides additional shunt capacitance across crystal 15, which adds to capacitance C2. Due to this additional capacitance, the amount of fixed capacitance C4 can be reduced correspondingly while maintaining the same steady state operating point for linear phase modulation. In practice, this permits a reduction in the value of C4 by a factor of approximately 50 percent. The value of C4 to be used is determined by adjusting C4 under quiescent circuit conditions until the total capacitance in shunt with crystal 15 provides a linear modulation operating point.

With the above in mind, the advantages of the circuit of this invention can now be readily understood. The amplified modulation signal, appearing at the collector of Q1 and also coupled to the base of Q2, causes time variations of both effective capacitances C1 and C2. Consequently, for a given modulation signal, there is a greater change in the total capacitance shunting crystal 15, in turn causing a greater change in amplitude and phase, which results in a greater modulation index for the overall circuit. An additional advantage is derived from the fact that when the oscillator-modulator is initially turned on, the circuit effect of capacitance C1 is not immediately felt across crystal 15, due to the circuit delay introduced by R2, C2 and C3. Typical values for these components are 22K, 1 microfarad, and 1 microfarad respectively. These three components cause sufficient delay in build-up of the quiescent operation of Q1, that capacitance C1 is substantially isolated from crystal 15 until the oscillator signal has built up through a relatively large number of cycles. Thus, during the initial starting period of the oscillator, the capacitance shunting the crystal, which tends to reduce oscillator amplitude, is lower in this circuit, permitting more reliable starting under low temperature conditions where the beta of the transistor is reduced. Only after the oscillator has grown to a substantial percentage of its steady state amplitude is capacitance C1 effectively coupled in shunt across crystal 15, by which time the oscillator is safely started.

It is thus seen that the circuit of this invention combines a modulation signal amplification stage with an oscillator-modulator multiplier circuit, with the transistor of the amplifier cooperating with the transistor of the oscillator to provide a higher modulation index transmitter, as well as a more efficient and more reliably started oscillator.

We claim

1. Modulator-oscillator apparatus, for producing a high frequency electrical signal which is amplitude and phase modulated by a modulation signal, comprising:
   a. a transistor amplifier having a first transistor with an effective output capacitor between its collector and emitter the value of which varies as a function of the voltage on the collector of said transistor, said amplifier having an input terminal connected to the base of said first transistor and to which said modulation signal is connected, and an output terminal connected to the collector of said first transistor and at which said modulation signal appears in amplified form, said amplified signal thus varying the value of said effective output capacitor;
   b. a crystal controlled oscillator, having a second transistor and a crystal connected to the base of said second transistor;
   c. a fixed value capacitor connected in shunt with said crystal;
   d. said second transistor having an effective input capacitor between its base and emitter which is a function of the voltage on said base of said second transistor, said effective input capacitor being connected in shunt with said crystal;
   e. coupling means for coupling said first transistor collector to the base of said second transistor and to said crystal, thereby connecting said effective output capacitor and said effective input capacitor together in shunt with said crystal and causing the amplified modulation signal to vary the effective value of said input capacitor; and
   f. said fixed capacitor, output capacitor and input capacitor being of a combined value so as to fix the operating point of said oscillator for said linear modulation, the amplitude and phase of said oscillation signal being varied when said modulation signal is connected to said amplifier input terminal.

2. A modulator-oscillator, for generating a high frequency signal modulated by a relatively low frequency modulation signal, comprising:
   a. an oscillator for generating said high frequency signal having a crystal in shunt with a fixed capacitor and a first voltage controlled capacitor;
   b. a second voltage controlled capacitor connected to said modulation signal such that its effective value is varied thereby;
   c. a power supply connected to said oscillator and said second voltage controlled capacitor; and
   d. a delay circuit coupling said second voltage controlled capacitor in shunt with said crystal such that when said power supply is coupled to said oscillator and said second voltage controlled capacitor, said second voltage controlled capacitor is not effectively coupled to said oscillator until after a predetermined time delay, during which time said oscillator appreciably reaches a steady state output, and after which time the amplitude and phase of said high frequency signal is varied as a function of the changing effective value of said second voltage controlled capacitor.

* * * * *